(12) United States Patent
Giamati

(10) Patent No.: US 9,738,397 B2
(45) Date of Patent: Aug. 22, 2017

(54) HEALTH MONITORING PNEUMATIC DEICER

(71) Applicant: Goodrich Corporation, Charlotte, NC (US)

(72) Inventor: Michael John Giamati, Akron, OH (US)

(73) Assignee: Goodrich Corporation, Charlotte, NC (US)

( * ) Notice: Subject to any disclaimer, the term of this patent is extended or adjusted under 35 U.S.C. 154(b) by 0 days.

(21) Appl. No.: 15/412,815

(22) Filed: Jan. 23, 2017

(65) Prior Publication Data

US 2017/0129622 A1    May 11, 2017

Related U.S. Application Data

(62) Division of application No. 14/606,624, filed on Jan. 27, 2015, now Pat. No. 9,598,176.

(51) Int. Cl.
| | |
|---|---|
| *B64D 15/16* | (2006.01) |
| *B64D 45/00* | (2006.01) |
| *B64F 5/60* | (2017.01) |
| *G01R 31/02* | (2006.01) |
| *G01R 31/00* | (2006.01) |

(52) U.S. Cl.
CPC ........... *B64D 45/00* (2013.01); *B64D 15/166* (2013.01); *B64F 5/60* (2017.01); *G01R 31/026* (2013.01); *B64D 2045/0085* (2013.01); *G01R 31/008* (2013.01)

(58) Field of Classification Search
CPC ........ B64D 15/166; B64D 15/00; B64C 3/46; Y02T 50/145
See application file for complete search history.

(56) References Cited

U.S. PATENT DOCUMENTS

| | | | | |
|---|---|---|---|---|
| 2,446,328 A | * | 8/1948 | Heston | B64D 15/166 244/134 A |
| 2,957,662 A | * | 10/1960 | Hess | B64D 15/166 244/134 R |
| 3,690,601 A | * | 9/1972 | Roemke | B64D 15/166 244/134 A |

(Continued)

FOREIGN PATENT DOCUMENTS

| | | |
|---|---|---|
| EP | 0105410 | 4/1984 |
| WO | WO9607588 | 3/1996 |

OTHER PUBLICATIONS

Extended European Search Report dated Jun. 15, 2016 in Application No. 16152894.8.

(Continued)

*Primary Examiner* — Valentina Xavier
(74) *Attorney, Agent, or Firm* — Snell & Wilmer L.L.P.

(57) ABSTRACT

A method of operating a monitored deicing system may comprise attempting, by a health monitor, to pass an electrical current through a signal wire disposed along a boot seam of a pneumatic deicer, evaluating, by the health monitor, a continuity of the signal wire in response to the electrical current, identifying, by the health monitor, that the signal wire lacks continuity in response to the evaluating, and determining, by the health monitor, that the boot seam has broken in response to the identification that the signal wire lacks continuity.

1 Claim, 4 Drawing Sheets

(56) References Cited

U.S. PATENT DOCUMENTS

| | | | | |
|---|---|---|---|---|
| 4,463,919 A * | 8/1984 | Bac | ........................ | B64D 15/16 244/134 A |
| 4,561,613 A * | 12/1985 | Weisend, Jr. | ......... | B64D 15/166 244/134 A |
| 4,613,102 A * | 9/1986 | Kageorge | ............. | B64D 15/166 244/134 A |
| 4,687,159 A * | 8/1987 | Kageorge | ............. | B64D 15/166 244/134 A |
| 4,779,823 A * | 10/1988 | Ely | ...................... | B64D 15/166 244/134 A |
| 5,248,116 A * | 9/1993 | Rauckhorst | .......... | B64D 15/166 244/134 A |
| 5,337,978 A * | 8/1994 | Fahrner | ................ | B64D 15/166 244/134 A |
| 5,523,959 A | 6/1996 | Seegmiller | | |
| 5,544,845 A * | 8/1996 | Giamati | ................. | B64D 15/16 244/134 A |
| 5,558,304 A * | 9/1996 | Adams | .................... | B64D 15/00 244/134 A |
| 6,384,611 B1 * | 5/2002 | Wallace | ................. | B64D 15/20 324/671 |
| 6,443,394 B1 * | 9/2002 | Weisend, Jr. | ............. | B64C 3/46 244/134 A |
| 6,520,452 B1 * | 2/2003 | Crist | ...................... | B64D 15/16 244/134 A |
| 2016/0214726 A1 | 7/2016 | Giamati | | |

OTHER PUBLICATIONS

Notice of Allowance and Fees Due dated Dec. 2, 2016 in U.S. Appl. No. 14/606,624.
Requirement for Restriction dated Jul. 1, 2016 in U.S. Appl. No. 14/606,624.

* cited by examiner

HEALTH MONITORING PNEUMATIC DEICER

CROSS REFERENCE TO RELATED APPLICATIONS

This application is a divisional of, and claims priority to, and the benefit of U.S. Ser. No. 14/606,624 filed on Jan. 27, 2015, and entitled "HEALTH MONITORING PNEUMATIC DEICER" which is incorporated by reference herein in its entirety.

FIELD

The present disclosure relates generally to a pneumatic deicers, and more specifically to pneumatic deicers with built-in health monitoring functionality.

BACKGROUND

A pneumatic deicer may include layers of fabric sewn together along stitchlines in a configuration to create a series of tubes along an aircraft structure. The tubes may be inflated to dislocate ice from the aircraft structure. However, due to wear, the stitchlines attaching the layers of fabric creating the series of tubes may break. As a result, the series of tubes may lose their shape as the stitchlines fail. Moreover, following the failure of a first stitchline, the failure of subsequent additional stitchlines often follows as the hoop stress increases. Often several stitchlines fail before crew and/or maintenance personnel become aware of the failures, such as during an in-flight icing situation when the pneumatic deicer fails to work effectively.

SUMMARY

A method of operating a monitored deicing system is disclosed. The method may include attempting, by a health monitor, to pass an electrical current through a signal wire disposed along a boot seam of a pneumatic deicer, evaluating, by the health monitor, a continuity of the signal wire in response to the electrical current, identifying, by the health monitor, that the signal wire lacks continuity in response to the evaluating, and determining, by the health monitor, that the boot seam has broken in response to the identification that the signal wire lacks continuity.

BRIEF DESCRIPTION OF THE DRAWINGS

The subject matter of the present disclosure is particularly pointed out and distinctly claimed in the concluding portion of the specification. A more complete understanding of the present disclosure, however, may best be obtained by referring to the detailed description and claims when considered in connection with the drawing figures, wherein like numerals denote like elements.

DETAILED DESCRIPTION

The detailed description of exemplary embodiments herein makes reference to the accompanying drawings, which show exemplary embodiments by way of illustration. While these exemplary embodiments are described in sufficient detail to enable those skilled in the art to practice embodiments of the disclosure, it should be understood that other embodiments may be realized and that logical changes and adaptations in design and construction may be made in accordance with this invention and the teachings herein. Thus, the detailed description herein is presented for purposes of illustration only and not limitation. The scope of the disclosure is defined by the appended claims. For example, the steps recited in any of the method or process descriptions may be executed in any order and are not necessarily limited to the order presented. Furthermore, any reference to singular includes plural embodiments, and any reference to more than one component or step may include a singular embodiment or step. Also, any reference to attached, fixed, connected or the like may include permanent, removable, temporary, partial, full and/or any other possible attachment option. Additionally, any reference to without contact (or similar phrases) may also include reduced contact or minimal contact.

Furthermore, any reference to singular includes plural embodiments, and any reference to more than one component or step may include a singular embodiment or step. Surface shading lines may be used throughout the figures to denote different parts but not necessarily to denote the same or different materials.

As used herein, "aft" refers to the direction associated with the trailing edge (e.g., the back end) of an aircraft structure. As used herein, "forward" refers to the direction associated with the leading edge (e.g., the front end) of an aircraft structure.

A first component that is "normally outward" of a second component means that a first component is positioned at a greater distance away from the surface of the aircraft structure as measured along a vector perpendicular to a tangent of the surface of the aircraft structure at the location of the first component, than the second component. A first component that is "normally inward" of a second component means that the first component is positioned at a lesser distance away from the surface of the aircraft structure as measured along a vector perpendicular to a tangent of the surface of the aircraft structure at the location of the first component, than the second component.

Figure 1:
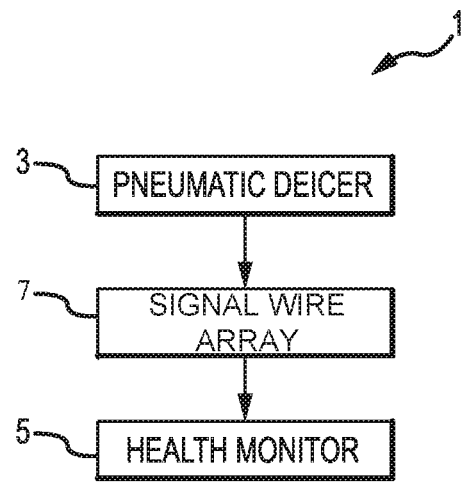
FIG. 1 illustrates a monitored deicing system having a pneumatic deicer, one or more signal wires, and health monitor according to various embodiments.
Figure 2:
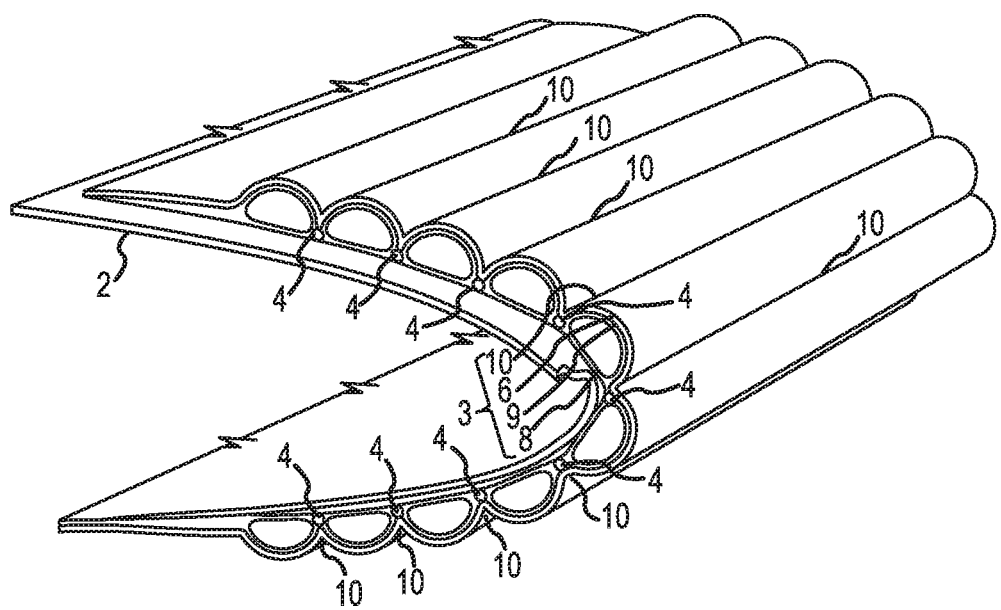
FIG. 2 illustrates a pneumatic deicer and one or more signal wires installed on an aircraft structure and having boot seams oriented perpendicular to a chord line of the aircraft structure, according to various embodiments.

With reference to FIGS. 1 and 2, a monitored deicing system 1 may include a pneumatic deicer 3, a signal wire array 7, and a health monitor 5. The pneumatic deicer 3 may deflate and inflate in order to dislodge ice from aircraft structures such as flight control structures, airfoils, empennages, fuselages, wings, and any desired aircraft part. The signal wire array 7 may comprise one or more signal wires 4 (FIG. 2) disposed through the pneumatic deicer 3. In the event of a pneumatic deicer 3 failure, one or more signal wires 4 (FIG. 2) of the signal wire array 7 may break, losing electrical continuity (and becoming an open circuit). A health monitor 5 may monitor electrical current(s) passed through the one or more signal wires 4 (FIG. 2) of the signal wire array 7. In response to a signal wire 4 breaking, the electrical current may halt (the circuit including one or more signal wire 4 of the signal wire array 7 and the health monitor 5 may become an open circuit), thus notifying the health monitor 5 of the breakage. In response, the health monitor 5 may alert a crew or maintenance personnel of the breakage. In further embodiments, the health monitor 5 may selectively deactivate part or all of a pneumatic deicer 3 in response to the breakage to prevent further failures, such as of portions of the pneumatic deicer 3 not immediately affected by the indicated breakage.

A pneumatic deicer 3 may be disposed along an airfoil. For instance, the pneumatic deicer may be disposed along the leading edge of an airfoil, such as a wing and/or a horizontal stabilizer. In various embodiments, the pneumatic deicer 3 may be disposed along a suction side of an airfoil. Alternatively, the pneumatic deicer 3 may be disposed along a pressure side of an airfoil. Moreover, the pneumatic deicer 3 may be disposed along both a suction side and a pressure side of an airfoil. In this manner, any portion of an aircraft susceptible to ice buildup may be equipped with a pneumatic deicer 3.

A signal wire 4 may be disposed through the pneumatic deicer 3. A signal wire 4 may comprise an electrically conductive fiber ("ECF"). The ECF may comprise a carbon fiber filament. In further embodiments, the ECF may comprise a wire. For instance, the ECF may comprise a fine diameter metal wire. The ECF may comprise a resistance wire, such as a wire made of an alloy of nickel and chromium (e.g, nickel-chromium wire, or "nichrome wire"). Thus, the ECF may comprise any conductive filament, fiber, wire, or material, as desired.

A health monitor 5 may comprise an electronic device in electrical communication with the signal wire 4 and capable of detecting breakage of the signal wire 4. For example, the health monitor 5 may comprise a continuity-testing device. The health monitor 5 may pass an electrical current through one or more signal wire 4 of a signal wire array 7. For instance, the health monitor 5 may pass small DC current(s) through each signal wire 4 and may monitor the resistance presented to the current(s) by the wire(s). Alternatively, the health monitor 5 may pass small AC current(s) through the signal wire(s) 4 and may monitor the impedance presented by the wire(s). In further embodiments, the health monitor 5 may pass momentary AC and/or DC current pulses through the signal wire(s) 4 to periodically assess an impedance and/or resistance of the signal wire(s) 4. Thus, the health monitor 5 may comprise any signal and/or current delivering device whereby the continuity of a signal wire 4 may be tested. For example, a health monitor 5 may have a processor and a tangible, nontransitory memory. The health monitor 5 may accept various inputs, may provide various outputs and perform certain logical processes in response to the inputs. The health monitor 5 may provide various outputs in response to the logical processes. For example, the health monitor 5 may receive a request from other aircraft systems to determine the continuity of a signal wire 4. The health monitor 5 may output a small electrical current through a signal wire 4. The health monitor 5 may determine the continuity of the signal wire 4 in response to the current, and may output a continuity status indication in response. For instance, outputting a continuity status indication may comprise at least one of alerting a crewmember, providing an indication of the status of the continuity of a signal wire 4 and/or signal wire array 7 (e.g., all the signal wires 4) to another aircraft system, storing a continuity status indication, or storing a continuity status indication for later communication to maintenance personnel.

Figure 3:
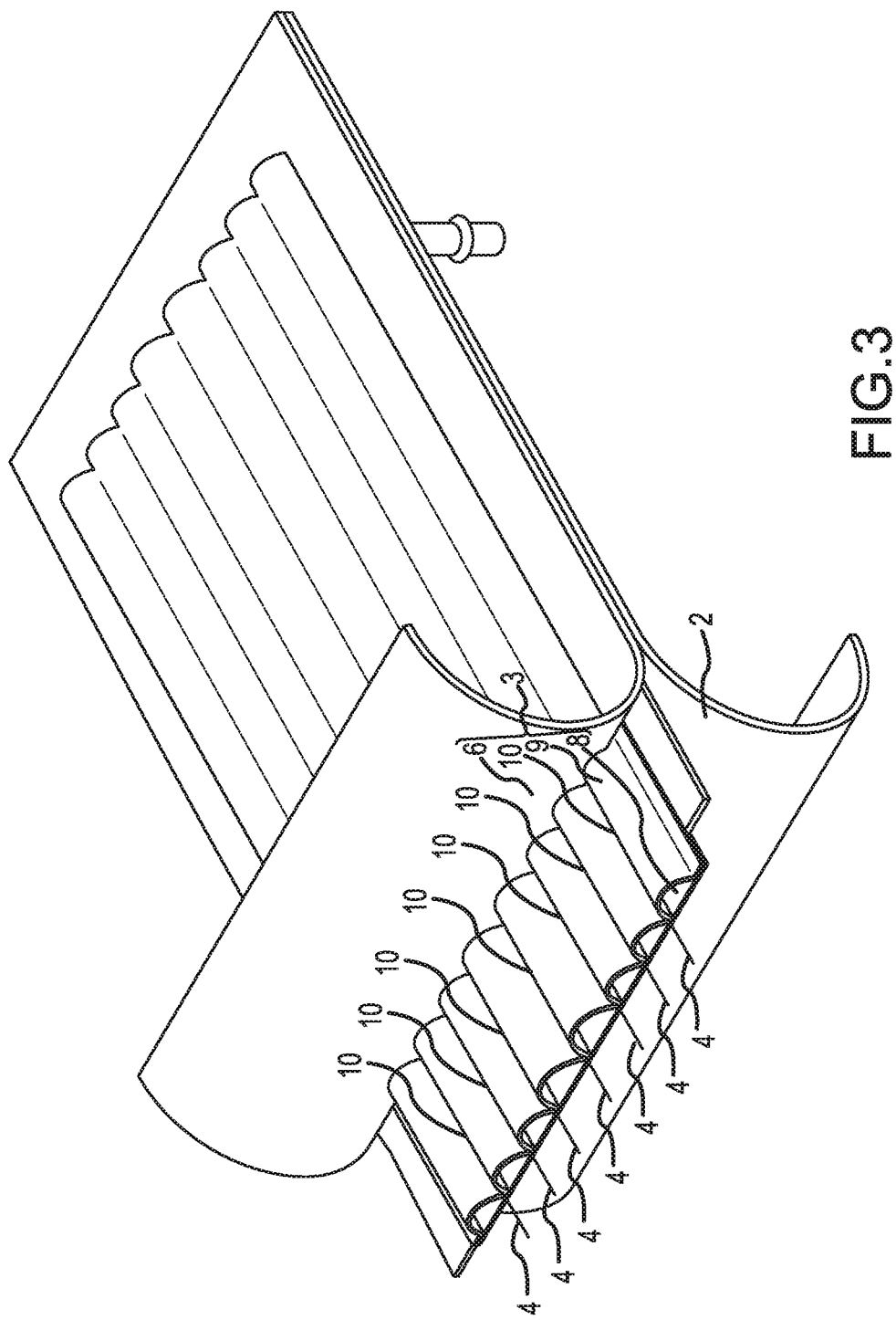
FIG. 3 illustrates a pneumatic deicer and one or more signal wires installed on an aircraft structure and having boot seams oriented parallel to a chord line of the aircraft structure, according to various embodiments.

With reference now to FIGS. 1-4, a pneumatic deicer 3 may comprise various components. For example, a pneumatic deicer 3 may comprise a covering layer 6, a forming layer 9, boot seams 10, and a base layer 8. Moreover, a pneumatic deicer 3 may comprise various orientations. For example, as illustrated in FIG. 2, a pneumatic deicer 3 may be oriented so that boot seams 10 lie perpendicular to the chord of an aircraft structure 2 (e.g., "spanwise boot seams"). As illustrated in FIG. 3, a pneumatic deicer 3 may be oriented so that boot seams 10 lie parallel to the chord of an aircraft structure 2 (e.g., "chordwise boot seams").

A base layer 8 may comprise a fabric layer. For instance, the base layer 8 may comprise a substantially inelastic fabric. The base layer 8 may however comprise any material as desired. In general, the base layer 8 resists stretching and distorting during inflation and deflation of the pneumatic deicer 3. The base layer 8 may be disposed immediately atop an aircraft structure 2.

A forming layer 9 may comprise a fabric layer. For instance, the forming layer 9 may comprise an elastic fabric. The forming layer 9 may however comprise any material as desired. In general, the forming layer 9 stretches during the inflation and deflation of the pneumatic deicer 3. As such, the forming layer 9 and the base layer 8 may comprise different materials. The forming layer 9 is disposed immediately atop the base layer 8.

The forming layer 9 and the base layer 8 may be joined together. Thus, the pneumatic deicer 3 may comprise boot seams 10. Boot seams 10 comprise stitching extending through the base layer 8 and the forming layer 9 and holding the base layer 8 and the forming layer 9 together. The forming layer 9 and the base layer 8 may be joined together by a plurality of boot seams 10 spaced and arranged to form tube structures from the union of the base layer 8 and the forming layer 9. The boot seams 10 may substantially seal the forming layer 9 and the base layer 8 against fluidic leakage at each boot seam 10. As such, compressed fluid, for example, air may be pumped between the forming layer 9 and the base layer 8. The forming layer 9 may expand in response to the compressed fluid. Because the boot seams 10 hold the forming layer 9 and the base layer 8 together and substantially seal them together, a series of ridges (e.g., raised tubular structures) may form in the pneumatic deicer 3 as the forming layer 9 expands, yet is stitched in union to the base layer 8 along the boot seams 10. Each raised tubular structure may dislodge ice from the aircraft structure 2 in response the expansion of the forming layer 9. The relative difference in expansion in the forming layer 9 near to and farther from each boot seam 10 further enhances the dislocation of ice from the aircraft structure 2.

The pneumatic deicer 3 may further comprise a covering layer 6. A covering layer 6 may comprise a substantially elastic material. Thus, the covering layer 6 may exert a counter force to that exerted by compressed fluid pumped into the pneumatic deicer 3 to expand the forming layer 9. Thus, the covering layer 6 may comprise a substantially elastic material whereby the forming layer 9 is compressed substantially flat upon the withdrawal of the compressed fluid. In this manner, as the pneumatic deicer 3 is deflated, the pneumatic deicer 3 may conform to a shape corresponding to that of the underlying aircraft structure 2. The covering layer 6 may further protect the forming layer 9 from damage, such as from puncturing by ice. In various embodiments, the covering layer 6 comprises rubber. For example, the covering layer 6 may comprise neoprene. However, the covering layer 6 may comprise any material as desired.

The signal wire(s) 4 of the signal wire array 7 of the monitored deicing system 1 may be co-located with aspects of the pneumatic deicer 3. For example, a signal wire 4 may be disposed parallel to the boot seam 10. In further embodiments, a signal wire 4 may comprise stitching immediately to one side of the boot seam 10. In this manner, the signal wire 4 may be subject to breaking prior to the boot seam 10. In further embodiments, a signal wire 4 is co-located with the boot seam 10 so that it will break substantially simultaneously with the boot seam 10. In still further embodiments, a signal wire 4 may wrap the boot seam 10, or may itself comprise the boot seam 10 or a portion of the boot seam 10.

Figure 4:
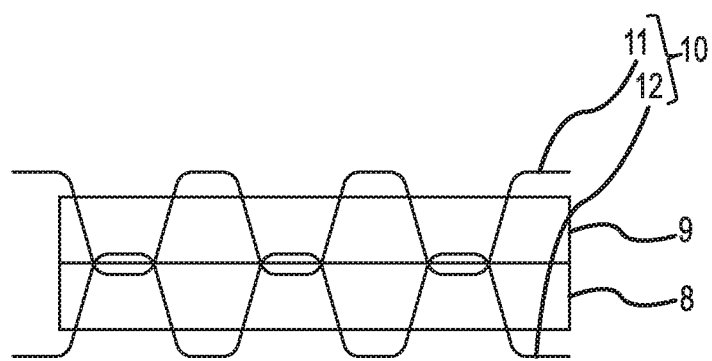
FIG. 4 illustrates an example boot seam of a pneumatic deicer, according to various embodiments.

With reference to FIG. 4, the boot seams 10 may comprise a main thread 11 and a bobbin thread 12. A main thread 11 may comprise a structural load bearing thread disposed through the forming layer 9. A bobbin thread 12 may comprise a structural load bearing thread disposed through the base layer 8. The bobbin thread 12 and the main thread 11 may overlap at least one of: substantially at the intersection of the forming layer 9 and the base layer 8 (e.g., "standard tension seam"), at the surface of the forming layer 9 (e.g. "forming layer anchored seam"), or at the inward surface of the base layer 8 (e.g., "base layer anchored seam").

A signal wire 4 may be co-located with the boot seam 10, as mentioned. In various embodiments, the signal wire 4 may be a filament woven into the bobbin thread 12. In further embodiments, the signal wire 4 may be a filament woven into the main thread 11. Similarly, a separate signal wire 4 may be woven into each of the bobbin thread 12 and main thread 11. In further embodiments, the signal wire 4 may be the bobbin thread 12, or the main thread 11, or both the bobbin thread 12 and the main thread 11. The signal wire 4 may wrap the bobbin thread 12, for example, in a helical spiral. Similarly, the signal wire 4 may wrap the main thread 11, for example, in a helical spiral. Moreover, a separate signal wire 4 may be wrapped around each of main thread 11 and the bobbin thread 12. Furthermore, a single signal wire 4 may comprise a single helix wrapping around the entire boot seam 10 (e.g., both main thread 11 and bobbin thread 12). By wrapping the signal wire 4 around at least one of the main thread 11 and the bobbin thread 12, a greater length of signal wire 4 is used than of the thread around which it is wrapped. As such, the structural load may be borne by the wrapped thread, rather than the signal wire 4, for example, in the instance that a signal wire 4 having less tensile strength than the wrapped thread, is used. In this manner, premature breakage of the signal wire 4 may be ameliorated, reducing signaling errors. In further embodiments, the signal wire 4 may be sewn around the boot seam 10, again, ameliorating premature breakage of the signal wire 4, reducing signaling errors.

Each signal wire 4 of the signal wire array 7 is connected in electrical communication with the health monitor 5. For example, a signal wire 4 may be terminated to lead wires connecting to the health monitor 5. In further embodiments, a signal wire 4 is terminated to thin polyimide bus bars connecting to an airframe wiring harness which then connects to the health monitor 5.

Figure 5:
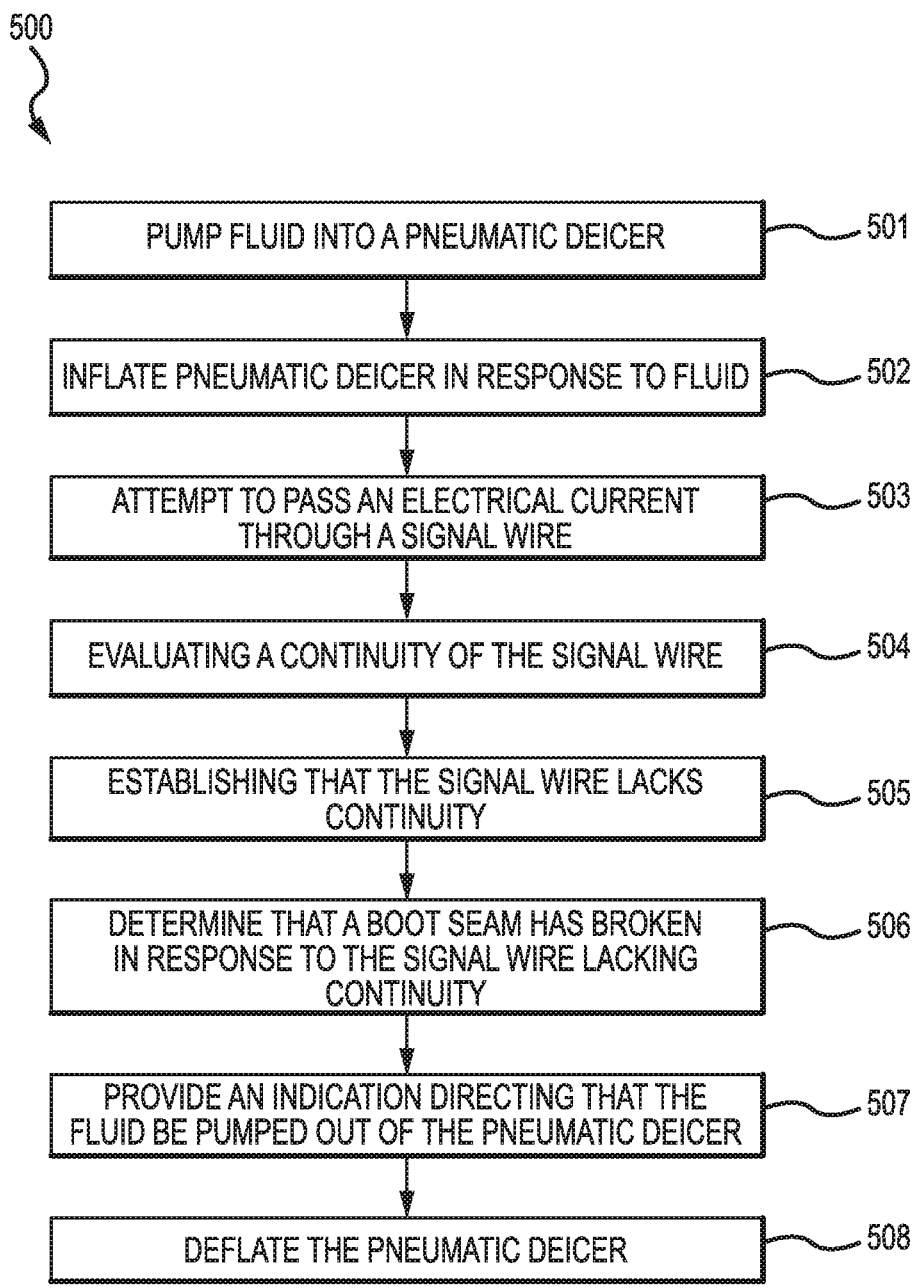
FIG. 5 illustrates an example method of operating a monitored deicing system.

With reference to FIGS. 1-4 and with further reference to FIG. 5, a monitored deicing system 1 may be operated according to various methods. For example, a method 500 of operating a monitored deicing system 1 may comprise the following steps. Fluid may be pumped into a pneumatic deicer 3 (Step 501). In various embodiments, the fluid comprises air. The pneumatic deicer 3 may inflate in response to the fluid (Step 502). A health monitor 5 may attempt to pass an electrical current through a signal wire 4 disposed along a boot seam 10 of the pneumatic deicer 3 (Step 503). The health monitor 5 may evaluate a continuity of the signal wire 4 in response to the electrical current (Step 504). In response to the electrical current failing to pass through the signal wire 4, the health monitor 5 may establish that the signal wire 4 lacks continuity (Step 505). In response to the signal wire 4 lacking continuity, the health monitor 5 may determine that the boot seam 10 has broken (Step 506). Consequently, the health monitor 5 may provide an indication directing that the fluid be pumped out of the pneumatic deicer 3 (Step 507). In response, the pneumatic deicer 3 may deflate (Step 508).

Various benefits and advantages have been described herein with regard to specific embodiments. Furthermore, the connecting lines shown in the various figures contained herein are intended to represent exemplary functional relationships and/or physical couplings between the various elements. It should be noted that many alternative or additional functional relationships or physical connections may be present in a practical system. However, the benefits, advantages, and any elements that may cause any benefit or advantage to occur or become more pronounced are not to be construed as critical, required, or essential features or elements of the disclosure. The scope of the disclosure is accordingly to be limited by nothing other than the appended claims, in which reference to an element in the singular is not intended to mean "one and only one" unless explicitly so stated, but rather "one or more." Moreover, where a phrase similar to "at least one of A, B, or C" is used in the claims, it is intended that the phrase be interpreted to mean that A alone may be present in an embodiment, B alone may be present in an embodiment, C alone may be present in an embodiment, or that any combination of the elements A, B and C may be present in a single embodiment; for example, A and B, A and C, B and C, or A and B and C.

The foregoing features and elements may be combined in various combinations without exclusivity, unless expressly indicated otherwise. These features and elements as well as the operation thereof will become more apparent in light of the following description and the accompanying drawings. It should be understood, however, the following description and drawings are intended to be exemplary in nature and non-limiting.

Systems, methods and apparatus are provided herein. In the detailed description herein, references to "various embodiments", "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described. After reading the description, it will be apparent to one skilled in the relevant art(s) how to implement the disclosure in alternative embodiments.

Furthermore, no element, component, or method step in the present disclosure is intended to be dedicated to the public regardless of whether the element, component, or method step is explicitly recited in the claims. No claim element herein is to be construed under the provisions of 35

U.S.C. 112(f), unless the element is expressly recited using the phrase "means for." As used herein, the terms "comprises", "comprising", or any other variation thereof, are intended to cover a non-exclusive inclusion, such that a process, method, article, or apparatus that comprises a list of elements does not include only those elements but may include other elements not expressly listed or inherent to such process, method, article, or apparatus.

The invention claimed is:

1. A method of operating a monitored deicing system comprising:
  attempting, by a health monitor, to pass an electrical current through a signal wire disposed along a boot seam of a pneumatic deicer;
  evaluating, by the health monitor, a continuity of the signal wire in response to the electrical current;
  identifying, by the health monitor, that the signal wire lacks continuity in response to the evaluating; and
  determining, by the health monitor, that the boot seam has broken in response to the identification that the signal wire lacks continuity.

* * * * *